United States Patent [19]

Klaczak et al.

[11] Patent Number: 4,962,545
[45] Date of Patent: Oct. 9, 1990

[54] VOLUME LEVEL RETENTION IN A PAGER

[75] Inventors: Lynne D. Klaczak, Boynton Beach; Mark T. Stair, Delray Beach, both of Fla.

[73] Assignee: Motorola, Inc., Schaumburg, Ill.

[21] Appl. No.: 310,184

[22] Filed: Feb. 13, 1989

[51] Int. Cl.⁵ .......................... H04B 1/16; H03G 3/00
[52] U.S. Cl. .................................... 455/200; 455/234; 340/825.44; 381/107
[58] Field of Search ............... 455/185, 186, 226, 228, 455/234, 343, 200, 232; 381/107, 104; 340/311.1, 825.44, 825.46

[56] References Cited

U.S. PATENT DOCUMENTS 4,314,375 2/1982 Belisomi .............................. 455/186
4,495,652 1/1985 Leslie .................................. 455/234
4,860,005 8/1989 DeLuca et al. ................. 340/825.44

FOREIGN PATENT DOCUMENTS 0297367 1/1989 European Pat. Off. ........ 340/825.44

*Primary Examiner*—Reinhard J. Eisenzopf
*Assistant Examiner*—Curtis Kuntz
*Attorney, Agent, or Firm*—William E. Zitelli; Vincent B. Ingrassia

[57] ABSTRACT

A selective call reciver, particularly a pager, is provided comprising an audio transducer for emitting audio signals, particularly voice. A volume setter is provided and a device, such as involatile memory, for protecting the volume setter when the receiver is switched off, whereby the volume set when the receiver is switched off is substantially the same as that when it is next switched on again.

4 Claims, 1 Drawing Sheet

VOLUME LEVEL RETENTION IN A PAGER

BACKGROUND OF THE INVENTION

The present invention relates to selective call receivers, particularly paging receivers (pagers), and more particularly to a paging receiver comprising an audio transducer for emitting an audible signal, wherein volume setting means are provided for controlling and setting the volume of the signal.

DESCRIPTION OF THE PRIOR ART

Digital pagers such as the PMR2000 manufactured by Motorola, Inc. are available which provide an audible signal (primarily voice) on receipt of an incoming paging signal. The volume of the audible signal is controllable by entering a volume control mode, by means of a mode button. In the volume control mode, the volume can be adjusted by means of a further button, and an indication is given on the display showing the relative volume set. On exiting the volume control mode by means of the mode button, the volume of the audible signal is set thereafter. In this manner, the user can, for example, set the volume to a very low, or silent, level when the user is entering an important meeting so as not to be disturbed by a distracting or potentially embarrassing voice message during the meeting. Moreover, different users have different preferences for a suitable volume during general use. The user can set the volume according to his personal preference.

It is a problem with prior art pagers that, when the pager is switched off, the volume level information is lost and it is necessary to reset the volume when the pager is next switched on. Switching off of the pager is essential for conserving battery power. Because of this loss of volume setting information, it can be highly irritating if the user neglects to reset the volume level, and is disturbed at an inconvenient time by a loud voice message. This is the case when the default setting for the alarm volume is maximum volume. Similarly, if the default setting is very low volume, it can be equally problematic if the user neglects to increase the volume upon switching on, and fails to hear an incoming voice message. Present pagers do not have sufficient memory to store voice messages, so if the message is not heard first time, it is lost.

SUMMARY OF THE INVENTION

It is an object of the present invention to provide a selective call receiver having an audio transducer, in which the volume set prior to switching off of the receiver is the same as that when the receiver is next switched on again. Accordingly, there is provided a selective call receiver comprising an audio transducer for emitting an audible signal, volume setting means for providing and retaining information relating to the volume of the audible signal and means for controlling the volume in accordance with said information. On/off means are provided for switching the receiver on and off, and means are provided for retaining said information when the receiver is switched off.

It is preferred that non-volatile memory is provided for retaining the information relating to the volume of the audible signal.

The audio transducer may be a loudspeaker for emitting voice messages, or it may be an alarm arranged to emit a series of short high pitch tone bursts.

DETAILED DESCRIPTION OF A PREFERRED EMBODIMENT

Figure 1:
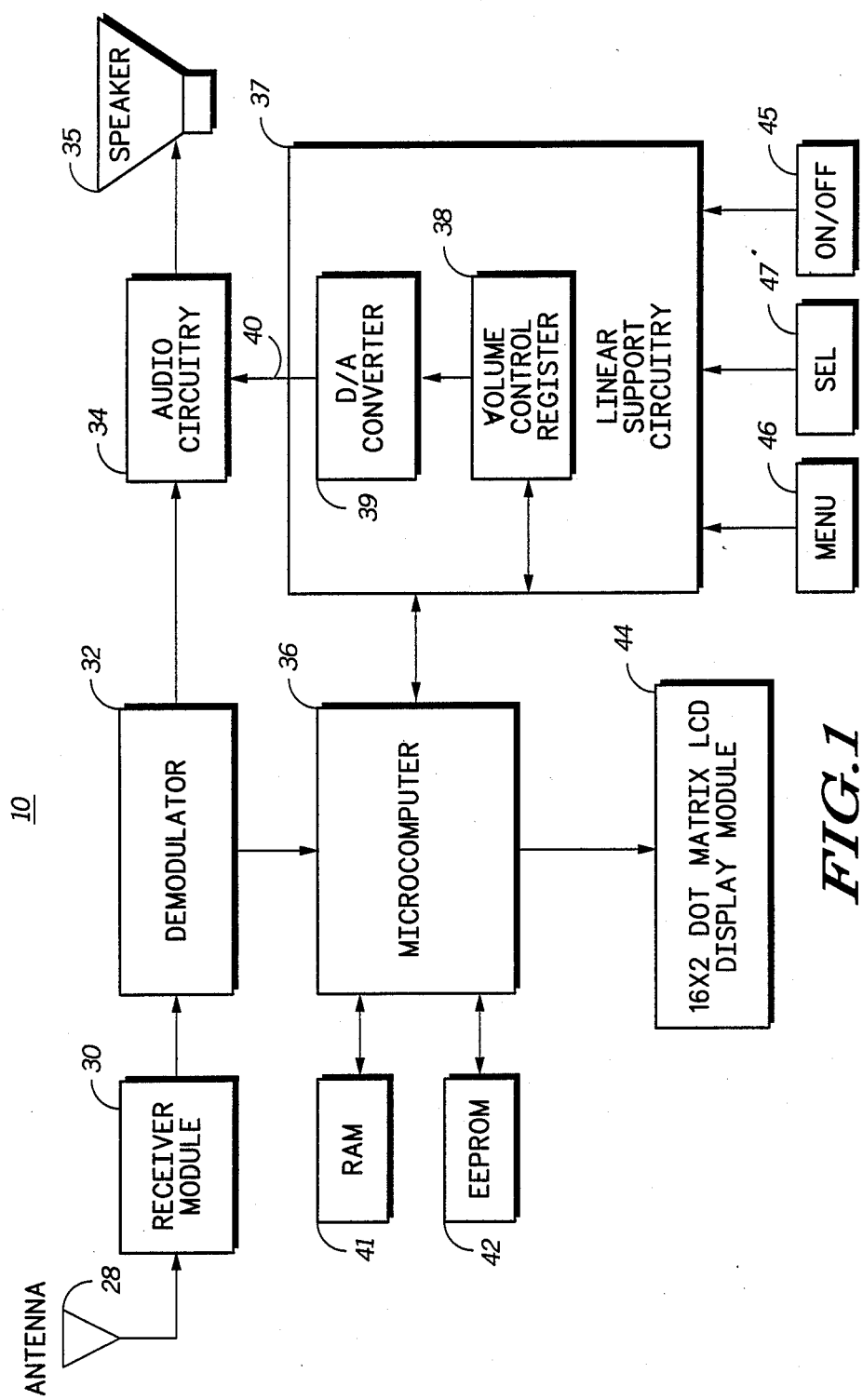
FIG. 1 illustrates a paging receiver incorporating the present invention.

For purposes of description of the preferred embodiment and ease of understanding of the present invention, it is convenient to choose the one-way selective call message and communications system known as paging.

FIG. 1 illustrates a paging receiver 10, according to the present invention, having an antenna 28 coupled to a receiver module 30. For the purposes of the present invention, the receiver module 30 may be treated as a well known frequency modulated (FM) receiver which includes channel elements to accurately tune and detect frequency modulated information. However, any number of types of other receivers may be used. Receiver module 30 receives RF signals from antenna 28 and passes intermediate frequency (IF) signals to a demodulator 32. Demodulator 32 demodulates the IF signals, and extracts relevant data and voice therefrom, in a manner known in the art. Demodulator 32 is connected to audio circuitry 34, which comprises an audio amplifier. Voice information is passed from the demodulator 32 to the audio circuitry 34, for output through a speaker 35 (or other suitable audio transducer). The demodulator 32 is also connected to a microcomputer 36 for passing other information, including such information as pager address and other page header information to the microcomputer 36. Microcomputer 36 is connected to RAM memory 41, EEPROM memory 42 and a 16×2 dot matrix LCD display module 44. RAM memory 41 and display module 44 perform functions of storing and displaying paging messages and storing and displaying other information, as is known in the art. EEPROM memory 42 represents additional nonvolatile memory over and above existing pagers of type PMR2000. Connected to the microcomputer and the audio circuitry is linear support circuitry 37 which includes a volume control code register 38, a digital-to-analog converter 39 and also includes a 1.5 volts battery, voltage regulator circuitry, and a voltage tripler for providing three volts for driving the microcomputer and other circuitry. These latter elements are not shown in the figure. There is an analog control line 40 extending from the linear support circuitry to a volume control input of the volume circuitry 34. The volume control input controls the gain of the audio amplifier within the audio circuitry 34. An on/off switch 45 is connected to the linear support circuitry 37 and is manually operable. Also connected to the linear support circuitry 37 are menu and select push buttons 46 and 47. Other inputs may also be provided.

The pager receives paging messages and decodes these and displays them on the display module 44, and passes voice data to the audio circuitry 34 for emitting through the speaker 35, these functions being comparable to existing pagers and being well known in the art.

The volume of the speaker 35 is set as follows. By pressing the menu button 46, a menu is displayed on display module 44, which menu includes at least one option of volume control setting. This option is selected by means of select button 47. Microcomputer 36 reads a volume control code from volume control code register 38 in linear support circuitry 37 and generates a volume indication dependent on this code, which is displayed on display 44 in the form of a bar extending across the display, the length of the bar indicating the volume. By further pressing of appropriate buttons 46 and 47, the volume is increased or decreased, with a corresponding extension or reduction in the length of the bar displayed, and by this means a new volume setting is selected. With each change in volume setting, the volume control code in register 38 is incremented or decremented accordingly. Upon final pressing of the select button 47, the volume control mode is exited. The volume control code stored in register 38 is provided via the digital-to-analog converter 39 to the analog line 40. On subsequent receipt of a voice message, this message is amplified by audio circuitry 34, the gain of the amplification being controlled by analog control line 40.

When the off button 45 is depressed, the linear support circuitry 37 sends a message to the microcomputer 36 informing the microcomputer of the instruction to switch off. Upon receipt of this instruction, microcomputer 36 reads the volume control setting code from volume control code register 38, and writes this code to EEPROM 42. Once the code has been written into this non-volatile memory, the microcomputer sends an instruction to the linear support circuitry 37 to switch off. Thereupon, the linear support circuitry shuts down the voltage tripler, and all other circuitry is thereby switched off. When the on/off button 45 is next depressed, the linear support circuitry 37 powers up its voltage tripler, thereby switching on the microcomputer 36, the receiver module 30, the demodulator 32 and all other circuitry. Upon power-up of the microcomputer 36, a reset routing is executed, which includes the step of reading the volume control code from EEPROM 42 and writing this into the volume control code register 38. In this manner, the audio circuitry 34 is immediately set to emit received voice data at the preset volume level, without further need to set the volume via menu and select buttons 46 and 47.

The volume level can be set between silent and full volume. Alternatively, or in addition, the audio circuitry 34 can include an oscillator and tone burst circuitry, which generates a series of high pitched tone bursts forming an alarm signal. The volume of this alarm signal can be controlled by analog control line 40. Alternatively, or in addition, the entire pager receiver can be made to vibrate, by means of a suitable transducer, whereby this vibration serves the same purpose as an audible alarm signal. Means can be provided in the volume control code register to enable the vibration mode to be selected instead of a simple volume setting so that upon receipt of a message the audible volume is set at 0, but the receiver is caused to vibrate.

As an alternative to providing non-volatile memory, the linear support circuitry can be arranged to continue to supply power to the volume control code register or a part of memory containing the volume control code when the receiver is switched off, while cutting off power to all other circuitry.

What is claimed is:

1. In a selective call receiver which is selectively energized and de-energized, retentive volume control circuitry comprising:
   an audio transducer for emitting an audio signal;
   volatile memory means operative to store a volume setting code only when said receiver is energized;
   first control means coupled to said audio transducer and first memory means and operative to control the volume of the audio signal emitted by said audio transducer in accordance with the volume setting code of said first memory means;
   means for altering the volume setting code of said first memory means;
   switch means for generating a first signal to initiate energization of said receiver of a second signal to initiate de-energization of said receiver;
   non-volatile memory means operative to store said volume setting code when the receiver is energized and to retain and volume setting code stored therein when the receiver is de-energized; and
   second control means coupled to said volatile and non-volatile memory means and governed by said first signal to initially energize the receiver and then transfer the retained volume setting code of the non-volatile memory means to the volatile memory means, and governed by said second signal to initially transfer the volume setting code of the volatile memory means to the non-volatile memory means for storage therein and then de-energize the receiver.

2. The selective call receiver of claim 1, wherein non-volatile memory is provided for retaining the information relating to the audible signal volume.

3. The selective call receiver of claim 2, wherein means are provided for receiving and demodulating radio frequency modulated voice signals, and wherein said audio transducer is arranged to emit said voice signals.

4. The selective call receiver of claim 2, wherein means are provided for emitting an alarm signal from the audio transducer.

* * * * *